(12) United States Patent
Mun et al.

(10) Patent No.: US 10,748,749 B1
(45) Date of Patent: Aug. 18, 2020

(54) PLASMA MONITORING APPARATUS, AND PLASMA PROCESSING APPARATUS INCLUDING THE SAME

(71) Applicant: SAMSUNG ELECTRONICS CO., LTD., Suwon-si (KR)

(72) Inventors: Jeong Il Mun, Suwon-si (KR); Kyeong Hun Kim, Suwon-si (KR); See Yub Yang, Suwon-si (KR); Hyung Joo Lee, Suwon-si (KR); Jong Woo Sun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/668,825

(22) Filed: Oct. 30, 2019

(30) Foreign Application Priority Data

Apr. 8, 2019 (KR) .......................... 10-2019-0041023

(51) Int. Cl.
*H01J 37/32* (2006.01)
*G01N 21/00* (2006.01)
*G01N 21/68* (2006.01)
*G01N 21/62* (2006.01)

(52) U.S. Cl.
CPC ........ *H01J 37/32972* (2013.01); *G01N 21/68* (2013.01); *H01J 37/32449* (2013.01); *H01J 37/32935* (2013.01); *G01N 21/62* (2013.01)

(58) Field of Classification Search
CPC ........... H01J 37/32972; H01J 37/32935; H01J 37/32449; H01J 2237/334; H01L 21/67253; H01L 21/3065; H01L 21/67069; H01L 21/67207; H01L 22/30; G01J 3/0291; G01F 7/70033; G01N 21/62
See application file for complete search history.

(56) References Cited

U.S. PATENT DOCUMENTS

| | | | |
|---|---|---|---|
| 5,986,747 A | 11/1999 | Moran | |
| 6,207,008 B1 | 3/2001 | Kijima | |
| 6,628,384 B2 | 9/2003 | Lee | |
| 7,339,656 B2 * | 3/2008 | Matsumoto | G01N 21/68 257/E21.252 |
| 7,462,293 B2 * | 12/2008 | Matsumoto | G01N 21/68 216/59 |
| 7,532,322 B2 * | 5/2009 | Koshimizu | G01N 21/68 356/316 |
| 7,582,182 B2 * | 9/2009 | Matsumoto | G01N 21/68 156/345.24 |

(Continued)

FOREIGN PATENT DOCUMENTS

| | | |
|---|---|---|
| KR | 10-1578978 B1 | 12/2015 |
| KR | 10-1829811 B1 | 2/2018 |

*Primary Examiner* — Vibol Tan
(74) *Attorney, Agent, or Firm* — Sughrue Mion, PLLC

(57) ABSTRACT

A plasma monitoring apparatus includes a reflective structure disposed on a processing chamber providing a space in which plasma for processing a substrate is formed, the reflective structure configured to receive fragments of light incident in a plurality of incident directions from the plasma, and output the fragments of light in a plurality of exit directions by reflecting the fragments of light within the reflective structure; at least one light sensor configured to receive the fragments of light passing through the reflective structure in the plurality of exit directions; and at least one optical spectrometer connected to the at least one light sensor.

19 Claims, 10 Drawing Sheets

(56) References Cited

U.S. PATENT DOCUMENTS

| | | |
|---|---|---|
| 7,907,260 B2 | 3/2011 | Venugopal et al. |
| 9,741,629 B2 * | 8/2017 | Usui ................ H01L 22/20 |
| 2002/0139925 A1 | 10/2002 | Mitrovic |
| 2005/0009347 A1 * | 1/2005 | Matsumoto ............ G01N 21/68 |
| | | 438/689 |
| 2008/0289765 A1 * | 11/2008 | Yokogawa ........ H01J 37/32935 |
| | | 156/345.29 |
| 2016/0284610 A1 * | 9/2016 | Usui .................. H01L 21/308 |
| 2018/0057935 A1 * | 3/2018 | Budiarto ................ G01N 21/94 |

\* cited by examiner

PLASMA MONITORING APPARATUS, AND PLASMA PROCESSING APPARATUS INCLUDING THE SAME

CROSS-REFERENCE TO RELATED APPLICATION

This application claims priority under 35 U.S.C. § 119 to Korean Patent Application No. 10-2019-0041023 filed on Apr. 8, 2019 in the Korean Intellectual Property Office, the disclosure of which is incorporated herein by reference in its entirety.

BACKGROUND

1. Field

Apparatuses consistent with example embodiments relate to a plasma monitoring apparatus and a plasma processing apparatus including the same.

2. Description Of Related Art

In the related art, a semiconductor device is manufactured through a plurality of unit processes including, for example, a deposition process using plasma, an etching process, and the like. In accordance with the miniaturization of semiconductor devices and high degree of integration of semiconductor products, the effects of a non-uniform distribution of plasma to the properties of semiconductor devices are increased.

SUMMARY

One or more example embodiments provide a plasma monitoring apparatus capable of observing plasma distribution in various regions within a processing chamber of a plasma processing apparatus and a plasma processing apparatus including the same.

According to an aspect of an example embodiment, there is provided a plasma monitoring apparatus including a reflective structure disposed on a processing chamber providing a space in which plasma for processing a substrate is formed, the reflective structure configured to receive fragments of light incident in a plurality of incident directions from the plasma, and output the fragments of light in a plurality of exit directions by reflecting the fragments of light within the reflective structure; at least one light sensor configured to receive the fragments of light passing through the reflective structure in the plurality of exit directions; and at least one optical spectrometer connected to the at least one light sensor.

According to an aspect of another example embodiment, there is provided a plasma monitoring apparatus including a reflective structure disposed on a processing chamber, the processing chamber providing a space in which plasma for processing a substrate is formed, the reflective structure configured to receive fragments of light incident in a plurality of incident directions from the plasma and configured to output the fragments of light in a plurality of exit directions; a shield disposed at a first end of the reflective structure, and having holes or slits transmitting a portion of light emitted from the plasma; a window disposed at a second end opposite to the first end of the reflective structure, and through which the fragments of light passing through the reflective structure are output; at least one light sensor configured to receive the fragments of light output from the window; and at least one optical spectrometer connected to the at least one light sensor. The reflective structure may include at least one pair of reflective surfaces disposed in parallel with each other, at least one pair of reflective surfaces being spaced apart from each other in a first direction extending parallel with an upper surface of the substrate.

According to an aspect of another example embodiment, there is provided a plasma processing apparatus including a processing chamber including: a side wall; and a space in which plasma for processing a substrate is formed; at least one hole passing through the side wall of the processing chamber; at least one reflective structure disposed in the at least one hole and having at least one pair of reflective surfaces extending in a direction parallel with each other; a shield disposed on an inner surface of the at least one reflective structure, and having holes or slits transmitting a portion of light emitted from the plasma; a window disposed on an outer surface of the reflective structure, and through which fragments of light reflected from the reflective structure are transmitted; at least one light sensor configured to receive the fragments of light transmitted through the window; and at least one optical spectrometer connected to the at least one light sensor. The at least one pair of reflective surfaces oppose each other in a direction extending parallel with an upper surface of the substrate.

According to an aspect of another example embodiment, there is provided a plasma monitoring apparatus including a reflective structure disposed in a wall of a processing chamber in which plasma for processing a substrate is formed, the reflective structure including a pair of reflective surfaces extending parallel with each other and configured to guide fragments of light emitted from the plasma through the reflective structure; at least one light sensor configured to receive the fragments of light passing through the reflective structure; and at least one optical spectrometer connected to the at least one light sensor. The reflective structure may be configured to receive the fragments of light incident in a plurality of incident directions from the plasma and output the fragments of light in a plurality of exit directions.

BRIEF DESCRIPTION OF DRAWINGS

The above and/or other aspects, features and other advantages of the disclosure will be more clearly understood from the following detailed description, taken in conjunction with the accompanying drawings, in which.

DETAILED DESCRIPTION

Hereinafter, a plasma processing apparatus according to example embodiments will be described with reference to the accompanying drawings.

Figure 1:
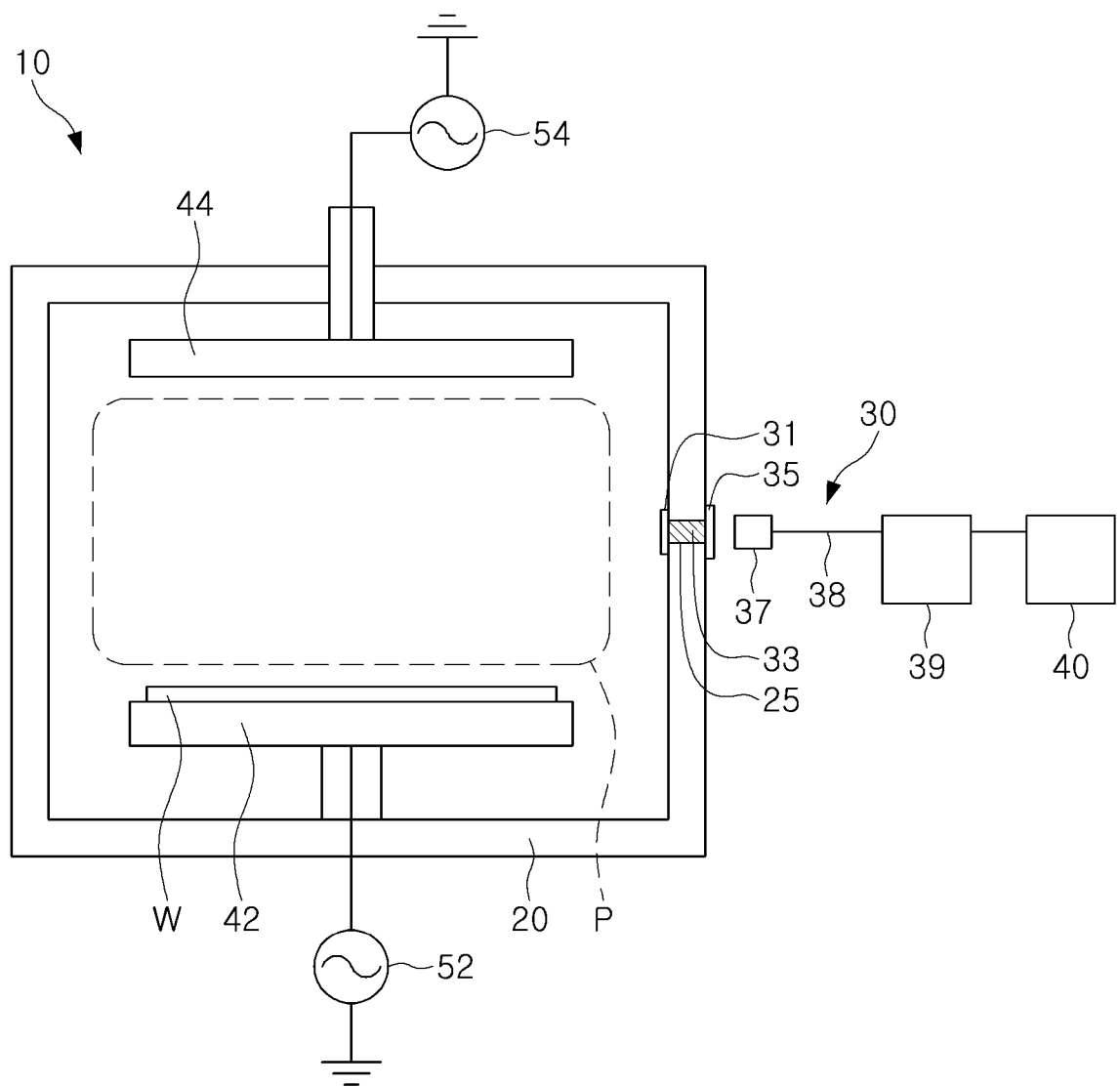
FIG. 1 is a schematic view illustrating a plasma processing apparatus according to an example embodiment.
Figure 2:
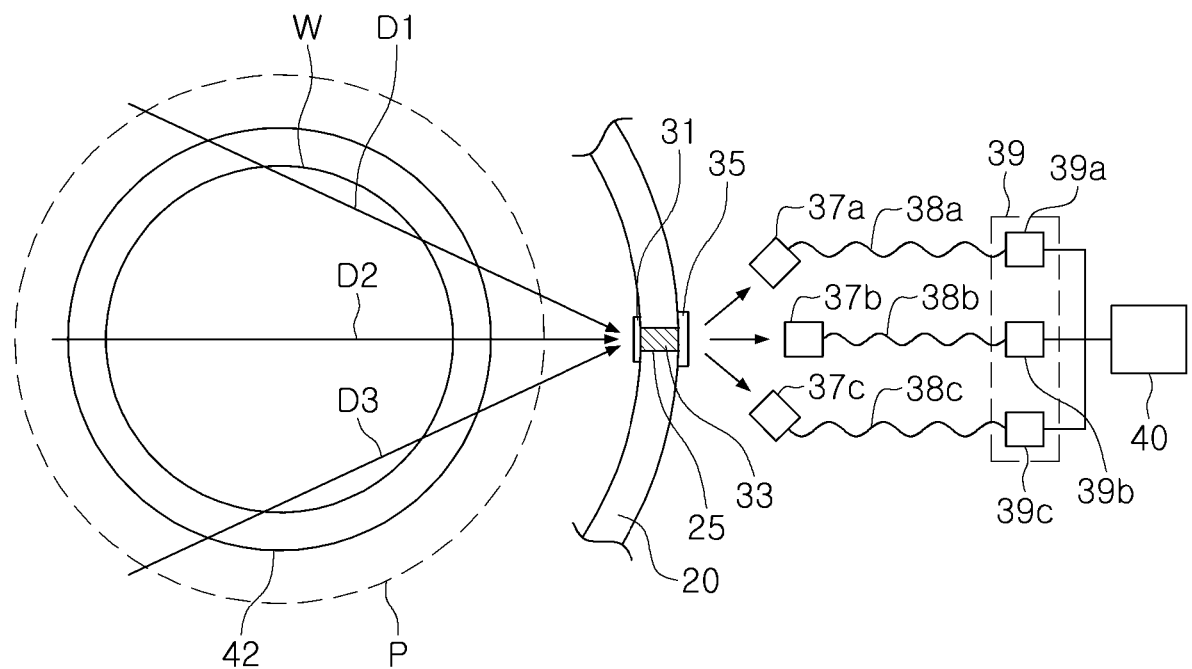
FIG. 2 is a view illustrating certain components of a plasma processing apparatus attached to a processing chamber according to an example embodiment.

FIG. 1 is a schematic view illustrating a plasma processing apparatus 10 according to an example embodiment. FIG. 2 is a view illustrating components of a plasma processing apparatus 10 according to an example embodiment.

Referring to FIGS. 1 and 2, a plasma processing apparatus 10 includes a processing chamber 20 having a space, in which a process for processing a substrate W using plasma P is performed, a chuck 42 for supporting the substrate W, an upper electrode 44 for formation of the plasma P using a process gas being supplied to the processing chamber 20, and a plasma monitoring apparatus 30 monitoring distribution of the plasma P in the processing chamber 20.

The substrate W may be, for example, a semiconductor substrate such as a silicon wafer for manufacturing a semiconductor device, or a glass substrate for manufacturing a flat panel display device. The process for processing the substrate W using the plasma may be, for example, an etching process, a deposition process, an ashing process, a cleaning process, or the like.

A radio frequency (RF) power source 54 for formation of the plasma P is connected to the upper electrode 44, and a bias power source 52 may be connected to the chuck 42.

The plasma monitoring apparatus 30 may include a shield 31, a reflective structure 33, a window 35, at least one light receiving device 37, at least one optical cable 38, and at least one spectroscopic device 39.

The reflective structure 33 is disposed in a hole 25 formed on a side wall of the processing chamber 20 providing the space in which the plasma P for processing the substrate W is formed, and may transfer or pass a plurality of fragments of light, incident on reflective structure 33 in a plurality of different incident directions D1, D2, and D3 from the plasma P, in a plurality of different exit directions. Light, incident on the reflective structure 33 in a first direction D1, and light, incident on the reflective structure 33 in a third direction D3, may be fragments of light emitted from the plasma P, formed on edge regions of the substrate W. Light, incident on the reflective structure 33 in the second direction D2, may be light, emitted from the plasma P, formed on a central region of the substrate W as shown in FIG. 2.

The reflective structure 33 is disposed in the hole 25 extending through a side wall of the processing chamber 20, and may have at least one pair of reflective surfaces extending parallel to each other. The description of the reflective structure 33 will be described later with reference to FIGS. 3 to 8.

Referring to FIGS. 1 and 2, the at least one light receiving device 37 may include a plurality of light receiving devices 37a, 37b, and 37c, aligned in different directions with respect to (or toward) the reflective structure 33, to receive fragments of light exiting in different exit directions from the reflective structure 33. For example, the first light receiving device 37a may receive light, incident on the reflective structure 33 in the first direction D1, through the reflective structure 33, the second light receiving device 37b may receive light, incident on the reflective structure 33 in the second direction D2, and the third light receiving device 37c may receive light, incident on the reflective structure 33 in the third direction D3.

The at least one light receiving device 37 may include at least one convex spherical lens or at least one concave mirror to collect light, moving in one direction among respective incident directions D1, D2, and D3, at an inlet of the at least one optical cable 38. For example, the at least one optical cable 38 is placed at a position of a focal length of a convex spherical lens to only collect fragments of light moving in a specific direction.

Referring to FIG. 2, the at least one optical cable 38 may include a plurality of optical cables 38a, 38b, and 38c, connected to the plurality of light receiving devices 37a, 37b, and 37c, respectively. The plurality of light receiving devices 37a, 37b, and 37c may be connected to the at least one spectroscopic device 39 through the plurality of optical cables 38a, 38b, and 38c.

Figure 12:
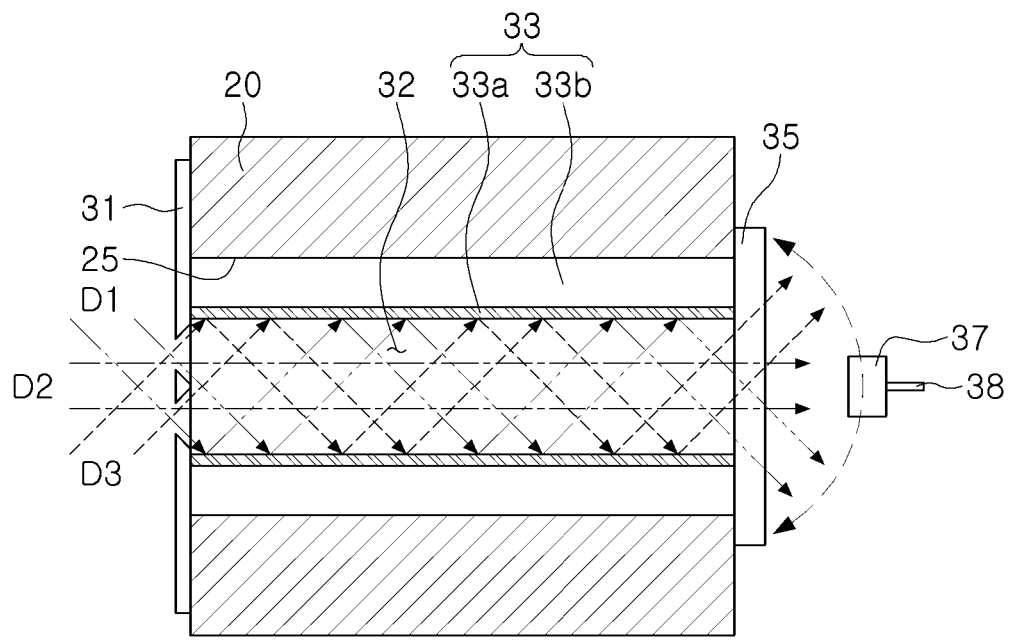

Alternatively, the at least one light receiving device 37 may move in a horizontal direction, parallel to an upper surface of the substrate W, in order to receive fragments of light exiting in different exit directions through the reflective structure 33 (see FIG. 12).

At least one spectroscopic device 39 may be a multi-channel optical emission spectrometer. Alternatively, at least one spectroscopic device 39 may include a plurality of spectroscopic devices 39a, 39b, 39c, connected to the plurality of light receiving devices 37a, 37b, and 37c, respectively as shown in FIG. 2.

The shield 31 is disposed in front of the reflective structure 33, while the window 35 may be disposed in the rear of the reflective structure 33. That is, the shield 31 is provided on an inner side of the side wall of the processing chamber 20 while the window 35 is provided on an outer side of the side wall of the processing chamber 20.

Figure 9A:
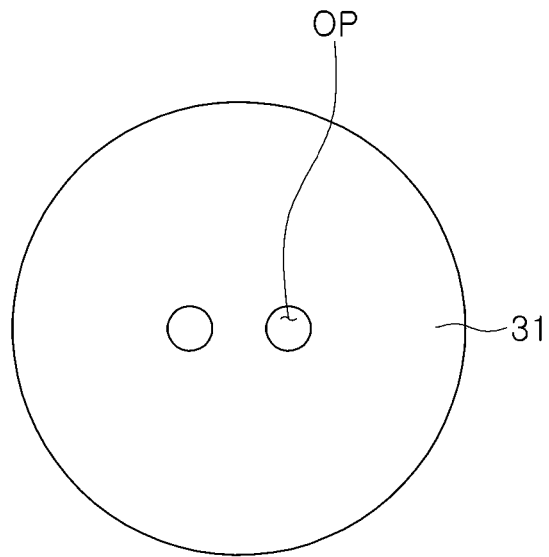
FIGS. 9A and 9B are cross-sectional views illustrating shields employed in a plasma monitoring apparatus according to example embodiments.
Figure 9B:
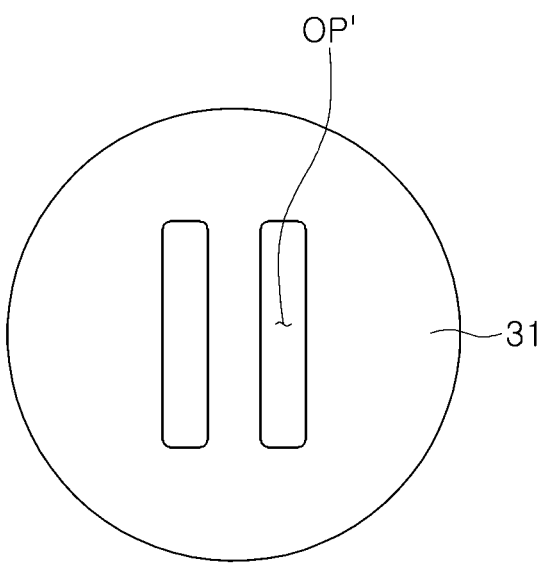

The shield 31 may include at least one hole OP or at least one slit OP' transmitting a portion of light emitted from the plasma P (see also FIGS. 9A and 9B). The at least one hole OP or at least one slit OP' may have a diverging diameter or a width, respectively, becoming greater toward the reflective structure 33. That is, a diameter or a width of an inlet of the at least one hole OP or the at least one slit OP' may be smaller than a diameter or a width of an outlet of the holes OP or the slits OP'. The shield 31 may include, for example, a pair of holes OP or a pair of slits OP' as shown in FIGS. 9A and 9B. The pair of holes OP may have, for example, a circular or elliptical shape. The pair of slits OP' may extend in a direction which is perpendicular or parallel to an upper surface of the substrate W, and may be arranged side by side with respect to each other. In the example embodiment, the shield 31 is coupled to an inner side surface of a side wall of the processing chamber 20. However, the example embodiment is not limited thereto. For example, the shield 31 may be spaced apart from the inner side surface of the side wall of the processing chamber 20 based on design intent.

The fragments of light, passing through the reflective structure 33, may be transmitted through the window 35. The window 35 may be formed of, for example, quartz. The window 35 may be coupled to an outer side surface of aside wall of the processing chamber 20 by a holder.

In the example embodiment, a gas supply pipe for supplying the process gas is connected to a side wall of the processing chamber 20, while a vacuum system for allowing the interior of the processing chamber 20 to be vacuum may be connected to a bottom of the processing chamber 20.

Figure 3:
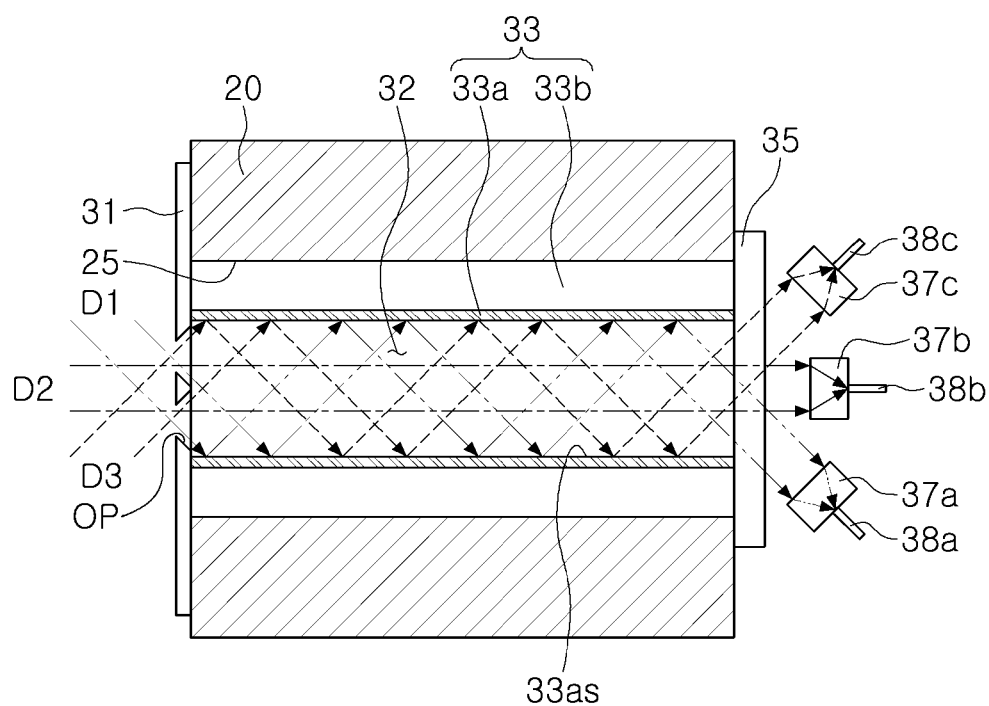
FIG. 3 is a view illustrating certain components of a plasma monitoring apparatus attached to a processing chamber according to an example embodiment.
Figure 4A:
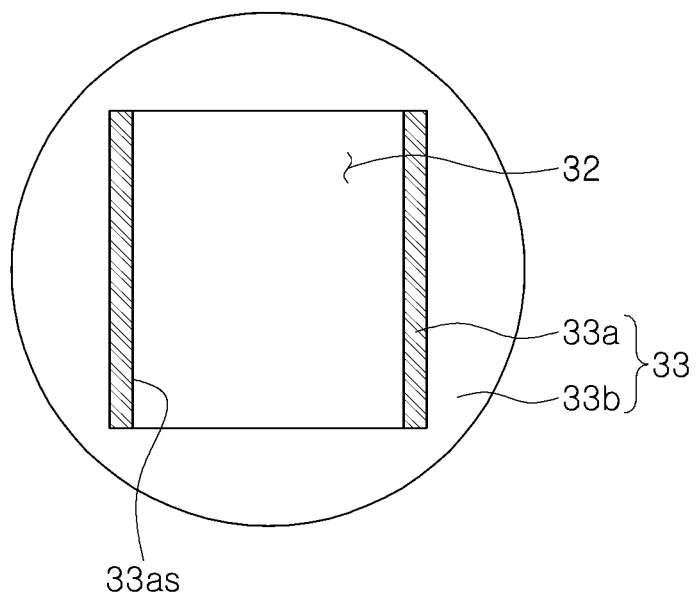
FIGS. 4A and 4B are cross-sectional views illustrating reflective structures of according to example embodiments.
Figure 4B:
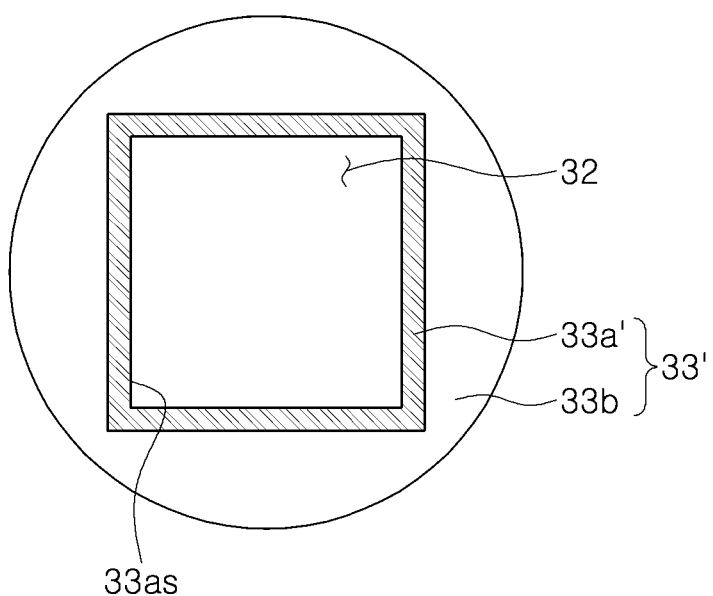

FIG. 3 is a view illustrating certain components of a plasma monitoring apparatus 30 attached to a processing chamber 20 according to an example embodiment. FIGS. 4A and 4B are cross-sectional views illustrating reflective structures 33 according to example embodiments.

Referring to FIGS. 3 and 4A, the reflective structure 33 is disposed in the hole 25 passing through a side wall of the processing chamber 20, and may have a pair of reflective surfaces 33as extending parallel to each other. The pair of reflective surfaces 33as may oppose each other in a horizontal direction parallel to the upper surface of the substrate W.

The reflective structure 33 may include a body 33b in which a through-hole 32 having a rectangular column shape is formed, and reflective layers 33a disposed on inner side surfaces opposing each other in a horizontal direction extending parallel to the upper surface of the substrate W, among four inner side surfaces of the body 33b. The pair of reflective surfaces 33as are surfaces of the reflective layers 33a. The reflective layers 33a may be formed of a reflective material. The reflective layers 33a may include, for example, a metal material such as silver (Ag). That is, the reflective structure 33 guides the fragments of light emitted from the plasma P via the reflective layers 33a toward the at least one light receiving device 37.

In the example embodiment, in order to allow light, incident on the reflective structure 33, to travel in a specific direction within the reflective structure 33, without being divided or separated within the reflective structure 33 and to exit toward the plurality of light receiving devices 37a, 37b, and 37c, but to only move toward a single light receiving device 37, a width of the through-hole 32 may be adjusted.

Referring to FIGS. 3 and 4B, in another example embodiment, the reflective structure 33' is disposed in the hole 25 passing through a side wall of the processing chamber 20, and may have two pairs of reflective surfaces 33as where each pair extends parallel to each other. Two pairs of reflective surfaces 33as may oppose each other in a horizontal direction parallel to the upper surface of the substrate W and a vertical direction, extending perpendicular to the upper surface of the substrate W.

The reflective structure 33' may include a body 33b, in which a through-hole 32 having a rectangular column shape is formed, and reflective layers 33a' disposed on four inner side surfaces opposing each other in a horizontal direction parallel to the upper surface of the substrate W and a vertical direction, extending perpendicular to the upper surface of the substrate W, among four inner side surfaces of the body 33b. Two pairs of reflective surfaces 33as are surfaces of the reflective layers 33a'. The reflective layers 33a' may be formed of a reflective material. The reflective layers 33a' may include, for example, a metal material such as silver (Ag).

Hereinafter, referring back to FIGS. 1 and 2, an example of a plasma distribution measurement process using a plasma monitoring apparatus 30 according to an example embodiment will be described.

The plasma monitoring apparatus 30 is used to obtain plasma optical emission spectra through at least one spectroscopic devices 39 including a plurality of spectroscopic devices 39a, 39b, and 39c, and the plurality of spectroscopic devices 39a, 39b, and 39c transmit the obtained plasma optical emission spectra to a control device 40 connected to the plurality of spectroscopic devices 39a, 39b, and 39c. The plurality of spectroscopic devices 39a, 39b, and 39c may be controlled by the control device 40. In the example embodiment, the control device 40 may be a computer, may be disposed in the vicinity of the plasma processing apparatus 10, or may be located in a remote location and connected to the plurality of spectroscopic devices 39a, 39b, and 39c via an intranet or Internet connection.

The control device 40 may be used to calculate a plasma light intensity distribution as a function of spatial location within the processing chamber 20 and wavelengths from the obtained plasma optical emission spectra, and may be used to calculate spatial distribution of chemical species of interest from the calculated plasma light intensity distribution.

In an example embodiment, the control device 40 may be configured to control a plasma monitoring apparatus 30 for plasma optical emission spectroscopy (OES).

As described above, in the plasma monitoring apparatus 30 illustrated in FIG. 2, through light incident in three different incident directions D1, D2, and D3 using three light receiving devices 37a, 37b, and 37c, plasma optical emission spectra in three distinct regions may be collected. The three distinct regions may represent regions in which the entire region of the substrate W is radially divided according to an arrangement direction of a reflective surface of the reflective structure 33 as well as an arrangement of the plurality of light receiving devices 37a, 37b, 37c or an movement of the light receiving device 37 (FIG. 12). In an example embodiment, the three distinct regions, measured by three light receiving devices 37a, 37b, and 37c, may have a partially overlapped region in the respective adjacent regions.

At least one of the components, elements or units represented by a block as illustrated by reference numeral 40 (a control device 40) in FIGS. 1 and 2 may be embodied as various numbers of hardware, software and/or firmware structures that execute respective functions described above, according to an exemplary embodiment. For example, at least one of these components, elements or units may use a direct circuit structure, such as a memory, processing, logic, a look-up table, etc. that may execute the respective functions through controls of one or more microprocessors or other control apparatuses. Also, at least one of these components, elements or units may be specifically embodied by a module, a program, or a part of code, which contains one or more executable instructions for performing specified logic functions. Also, at least one of these components, elements or units may further include a processor such as a central processing unit (CPU) that performs the respective functions, a microprocessor, or the like. Further, although a bus is not illustrated in the above block diagrams, communication between the components, elements or units may be performed through the bus. Functional aspects of the above exemplary embodiments may be implemented in algorithms that execute on one or more processors. Furthermore, the components, elements or units represented by a block or processing steps may employ any number of related art techniques for electronics configuration, signal processing and/or control, data processing and the like.

Fragments of light from three distinct regions are incident on respective light receiving devices 37a, 37b, and 37c, and the plasma optical emission spectra, collected from the incident light, are transmitted to a control device 40. Then, the control device 40 may be used to further process the transmitted data to calculate the space distribution of plasma optical emission, and calculate spatial distribution of a concentration of a chemical species therefrom. Plasma optical emission spectra, obtained from three separate fragments of light, may be combined to provide plasma distribution information of the entire region of the substrate W.

Figure 5:
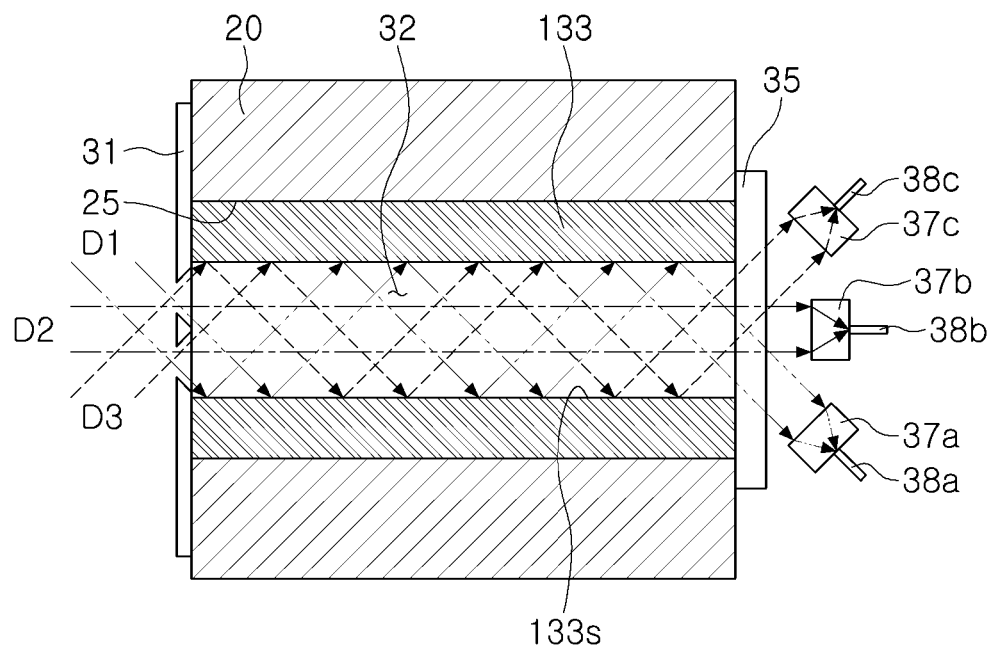
FIG. 5 is a view illustrating certain components of a plasma monitoring apparatus attached to a processing chamber according to an example embodiment.
Figure 6:
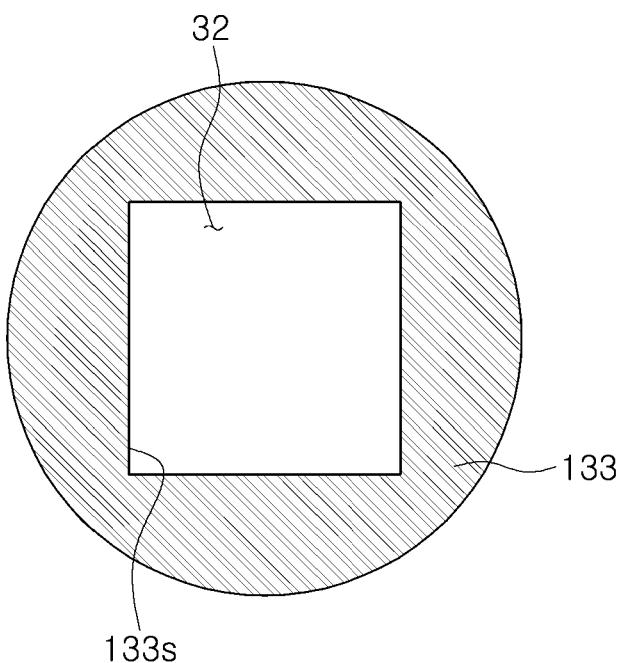
FIG. 6 is a cross-sectional view illustrating a reflective structure according to an example embodiment.

FIG. 5 is a view illustrating certain components of a plasma monitoring apparatus 30 attached to a processing chamber 20 according to an example embodiment. FIG. 6 is a cross-sectional view illustrating a reflective structure 133 according to an example embodiment.

Referring to FIGS. 5 and 6, a reflective structure 133 is disposed in a hole 25 passing through a side wall of a processing chamber 20, and may have two pairs of reflective surfaces 133as, parallel to each other similar to an example embodiment shown in FIG. 4B. The reflective structure 133 is provided with a through-hole 32 having a rectangular column shape, and may be formed of a reflective material. The reflective material may include, for example, a metal material such as silver (Ag). Two pairs of reflective surfaces 133as correspond to two pairs of inner side surfaces of the reflective structure 133 opposing each other in a horizontal direction parallel to the upper surface of the substrate W and a vertical direction extending perpendicular to the upper surface of the substrate W. In order to allow light, incident on the reflective structure 133 to pass in a specific direction within the reflective structure and to move toward a single light receiving device (instead of being divided and move toward a plurality of light receiving devices), a width of the through-hole 32 may be adjusted.

Figure 7:
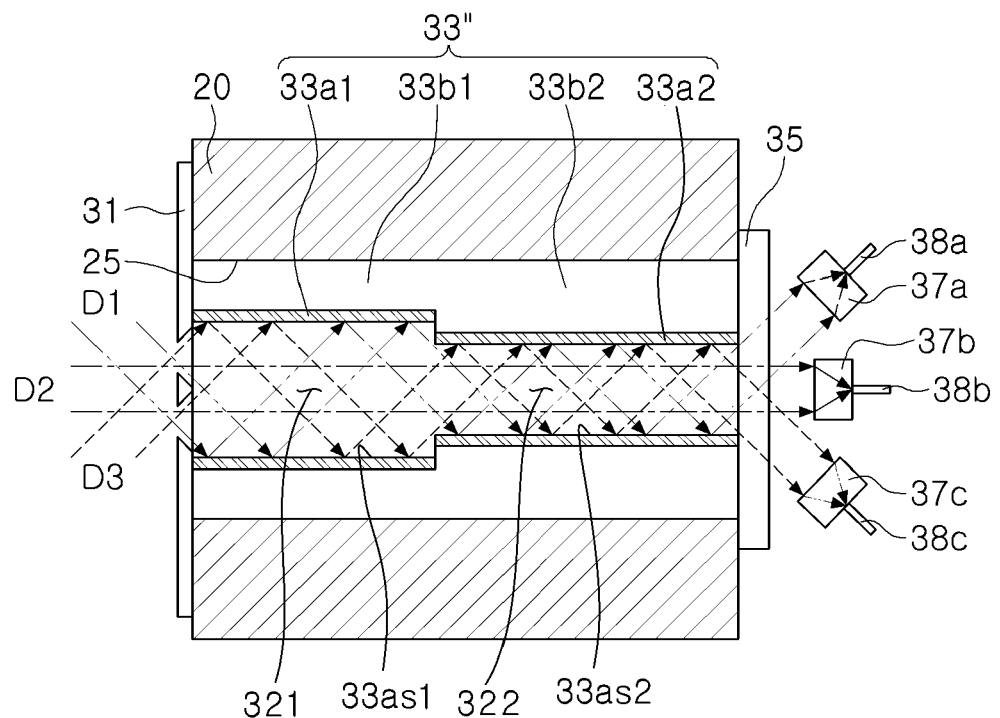
FIGS. 7 and 8 are views illustrating certain components of a plasma monitoring apparatus attached to a processing chamber according to example embodiments.
Figure 8:
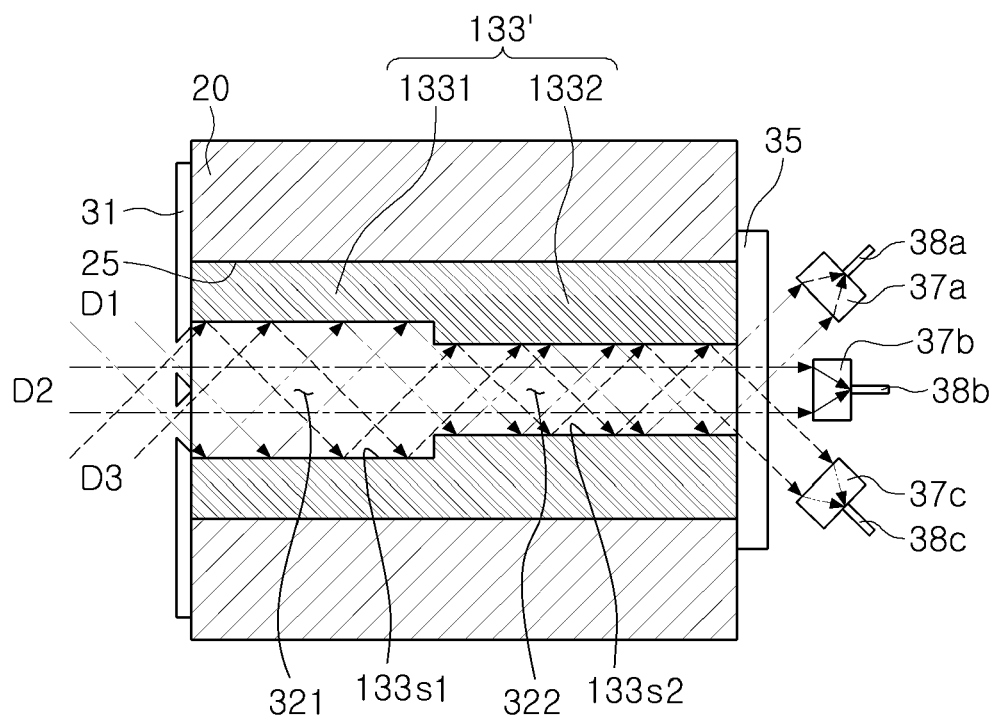

FIGS. 7 and 8 are views illustrating certain components of a plasma monitoring apparatus 30 according to example embodiments.

Referring to FIG. 7, a reflective structure 33" may have a plurality of regions in which a separation distance of each of a pair of reflective surfaces, opposing each other in a horizontal direction parallel to the upper surface of the substrate W, are different from each other. The plurality of regions may have different lengths in a direction of a central axis of the at least one hole.

For example, the reflective structure 33" may include a first body 33b1 including a first through-hole 321 having a rectangular column shape and a second body 33b2 including a second through-hole 322 having a rectangular column shape. A width (a separation distance) of the first through-hole 321 may be greater than a width (a separation distance) of the second through-hole 322. The reflective structure 33" may further include first reflective layers 33a1 disposed on inner side surfaces opposing each other in a horizontal direction parallel to the upper surface of the substrate W, among four inner side surfaces of the first body 33b1, and second reflective layers 33a2 disposed on inner side surfaces opposing each other in a horizontal direction parallel to the upper surface of the substrate W, among the four inner side surfaces of the second body 33b2. A distance between surfaces of the first reflective layers 33a1, that is, a distance between the first reflective surfaces 33as1, may be greater than a distance between surfaces of the second reflective layers 33a2, that is, a distance between the second reflective surfaces 33as2.

The first body 33b1 and the second body 33b2 may have different lengths (axial length) in a direction of a central axis of the hole 25.

In order to allow light, incident on the reflective structure 33" to pass through the reflective structure 33" in a specific direction without being divided and to exit toward a plurality of light receiving devices, but to only move toward a single light receiving device, widths of the first through-hole 321 and the second through-hole 322 are adjusted, or lengths of the first body 33b1 and the second body 33b2 are adjusted, or the widths of the first through-hole 321 and the second through-hole 322 and the lengths of the first second body 33b1 and the second body 33b2 may be adjusted together.

Although the example embodiment includes two separate regions, the example embodiment is not limited thereto. For example, the reflective structure 33" may include three or more bodies having through-holes with different widths.

Referring to FIG. 8, a reflective structure 133' may have a plurality of regions in which a separation distance of each of a pair of reflective surfaces, opposing each other in a horizontal direction parallel to the upper surface of the substrate W, are different from each other. The plurality of regions may have different lengths in a direction of a central axis of the at least one hole.

For example, the reflective structure 133' may include a first region 1331 including a first through-hole 321 having a rectangular column shape and a second region 1332 including a second through-hole 322 having a rectangular column shape. A width (a separation distance) of the first through-hole 321 may be greater than a width (a separation distance) of the second through-hole 322. The reflective structure 133' may be formed of a reflective material.

The reflective material may include, for example, a metal material such as silver (Ag).

A distance between surfaces of the first region 1331, that is, a distance between the first reflective surfaces 133s1, may be greater than a distance between surfaces of the second region 1332, that is, a distance between the second reflective surfaces 33as2.

The first region 1331 and the second region 1332 may have different lengths in a direction of a central axis (i.e., an axial direction) of the hole 25.

In order to allow light, incident on the reflective structure 133' to pass through in a specific direction without being divided and to move toward a plurality of light receiving devices, but to only move toward a single light receiving device, a width of the first through-hole 321 and the second through-hole 322, respectively, are adjusted, or lengths of the first region 1331 and the second region 1332 are adjusted, or the widths of the first through-hole 321 and the second through-hole 322 and the lengths of the first region 1331 and the second region 1332 may be adjusted together.

Although the example embodiment includes two separate regions, the example embodiment is not limited thereto. For example, the reflective structure 133' may include three or more regions having through-holes with different widths.

Figure 10:
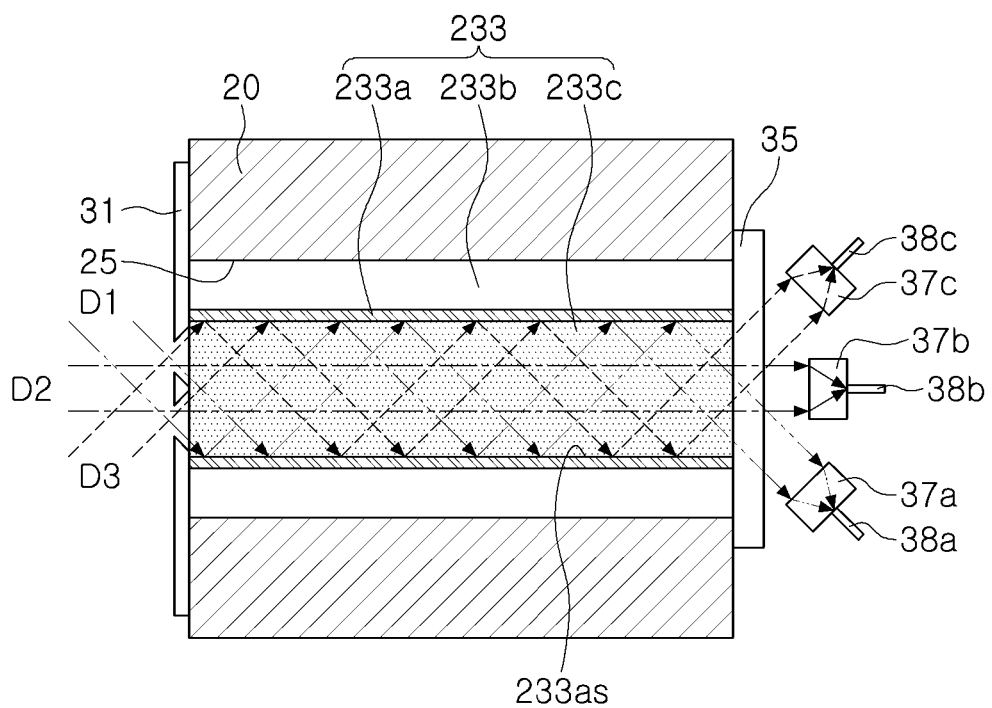
FIGS. 10 to 13 are views illustrating certain components of a plasma monitoring apparatus attached to a processing chamber according to an example embodiment.
Figure 11:
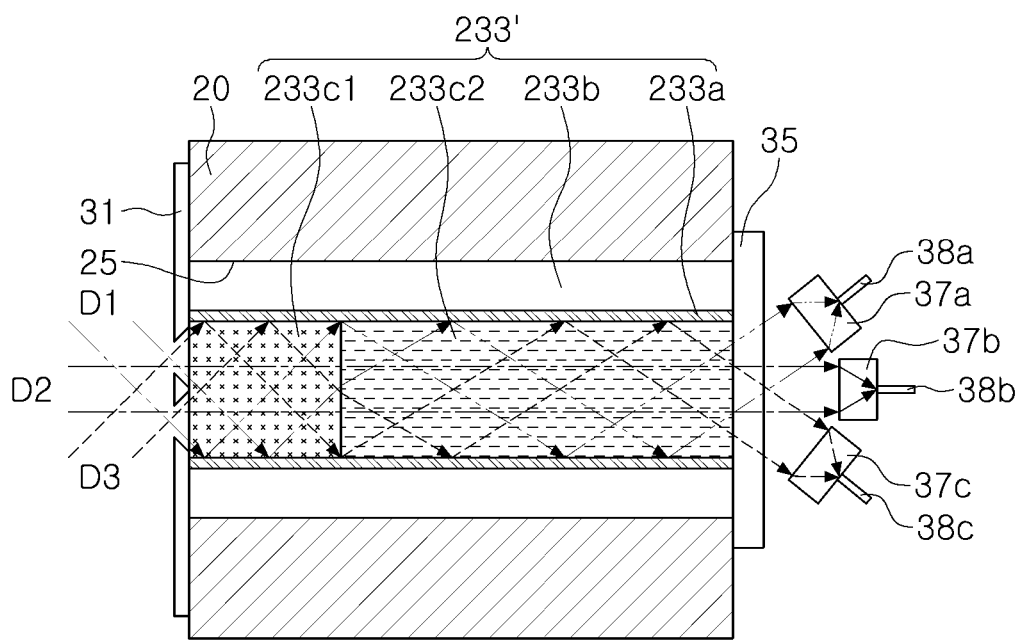

FIGS. 10 and 11 are views illustrating certain components of a plasma monitoring apparatus 30 attached to a processing chamber 20 according to example embodiments.

Referring to FIG. 10, a reflective structure 233 may include a core 233c having a rectangular column shape, a body 233b surrounding the core 233c, and reflective layers 233a disposed between the core 233c and the body 233b and opposing each other in a horizontal direction parallel to the upper surface of the substrate W. A pair of reflective surfaces 233as are interfaces between the core 233c and the reflective layers 233a. The core 233c may be formed of a material through which light could be transmitted. The core 233c may include, for example, quartz, sapphire, glass, or the like. The reflective layers 233a may be formed of a reflective material. The reflective layers 233a may include, for example, silver (Ag). Alternatively, the reflective layers 233a may be a material having a refractive index smaller than that of the core 233c, and fragments of light, incident on the reflective structure 233, may be totally reflected at an interface between the core 233c and the reflective layers 233a.

The reflective structure 233 may further include reflective layers opposing each other in a vertical direction, vertical to the upper surface of the substrate W similar to an example embodiment shown in FIG. 4B.

Referring to FIG. 11, in a manner different from that of an example embodiment illustrated in FIG. 10, the reflective structure 233' may include a plurality of sub-cores 233c1 and 233c2, sequentially disposed in a direction (i.e., an axial direction) of a central axis of the hole 25 and having different refractive indices. For example, a refractive index of the first sub-core 233c1 may be smaller than a refractive index of the second sub-core 233c2.

In order to allow light, incident on the reflective structure 233' to pass in a specific direction without being divided and move toward a plurality of light receiving devices, but rather to only move toward a single light receiving device, a length of the first sub-core 233c1 and a length of the second sub-core 233c2 may be adjusted accordingly. If necessary, a width of the first sub-core 233c1 and a width of the second sub-core 233c2 may be adjusted.

Figure 13:
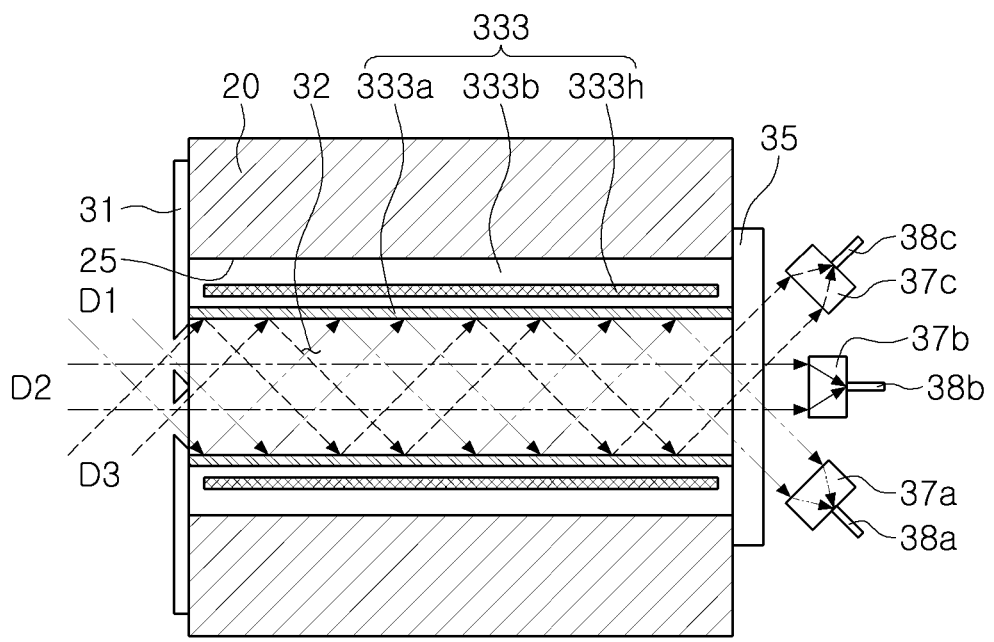
Figure 14A:
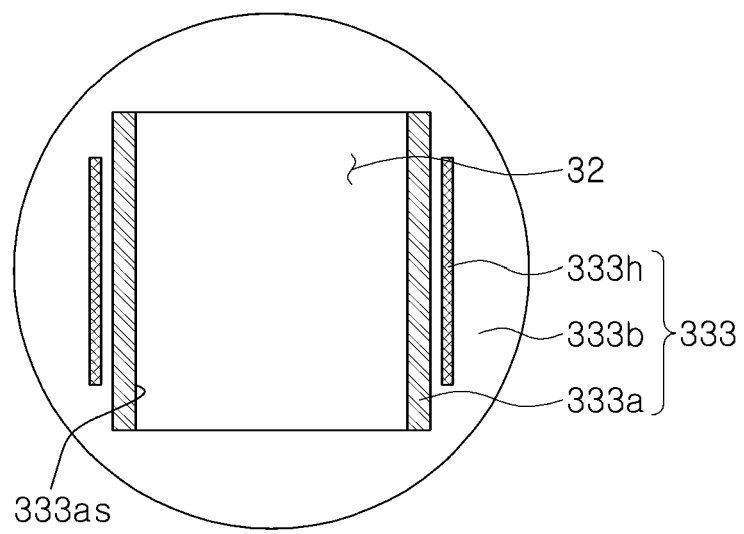
FIGS. 14A and 14B are cross-sectional views illustrating reflective structures according to example embodiments.
Figure 14B:
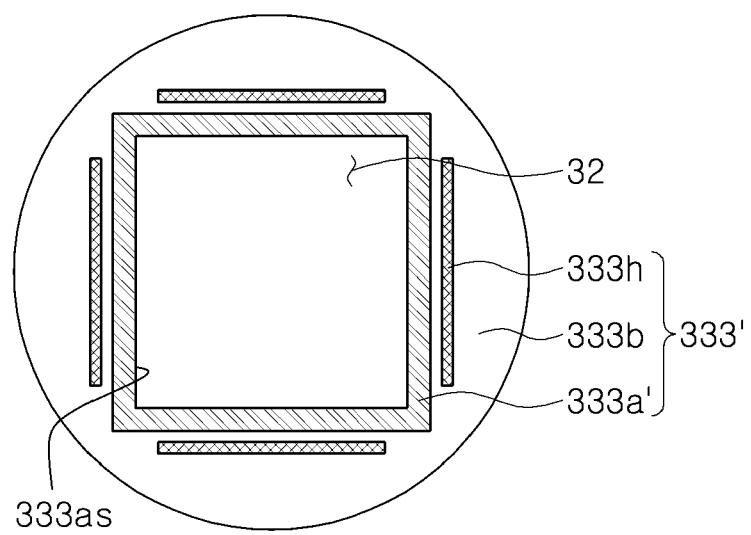

FIG. 13 is a view illustrating certain components of a plasma monitoring apparatus 30 attached to a processing chamber 20 according to an example embodiment. FIGS. 14A and 14B are cross-sectional views illustrating reflective structures 333, 333' according to example embodiments.

Referring to FIGS. 13 and 14A, a reflective structure 333 may further include a heater 333h, as compared with the reflective structure 33 of FIGS. 3 and 4A.

The reflective structure 333 may include a body 333b in which a through-hole 32 having a rectangular column shape is formed, and reflective layers 333a disposed on inner side surfaces opposing each other in a horizontal direction parallel to the upper surface of the substrate W, among four inner side surfaces of the body 333b. The reflective layers 333a may be formed of a reflective material. The reflective layers 333a may include, for example, a metal material such as silver (Ag). Two heaters 333h may be disposed adjacent to the reflective surfaces 333as of the reflective layers 333a.

Referring to FIGS. 13 and 14B, a reflective structure 333' may further include a heater 333h, as compared with the reflective structure 33' of FIG. 4B.

The reflective structure 333' may include a body 333b, in which a through-hole 32 having a rectangular column shape is formed, and reflective layers 333a' disposed on four inner side surfaces opposing each other in a horizontal direction parallel to the upper surface of the substrate W and a vertical direction, extending perpendicular to the upper surface of the substrate W, among four inner side surfaces of the body 333b. Four heaters 333h may be disposed adjacent to the reflective surfaces 333as of the reflective layers 333a.

The heaters 333h may prevent process byproducts from being deposited on the reflective surfaces 333as, and may maintain the optimum reflectivity of the reflective surfaces 333as.

The plasma processing apparatus 10 according to an example embodiment may further include a control device 40 controlling operations of the heaters 333h.

The heaters may be employed in the reflective structures 33", 133, 133', 233, 233', 333, and 333' shown in the previous example embodiments.

Figure 15:
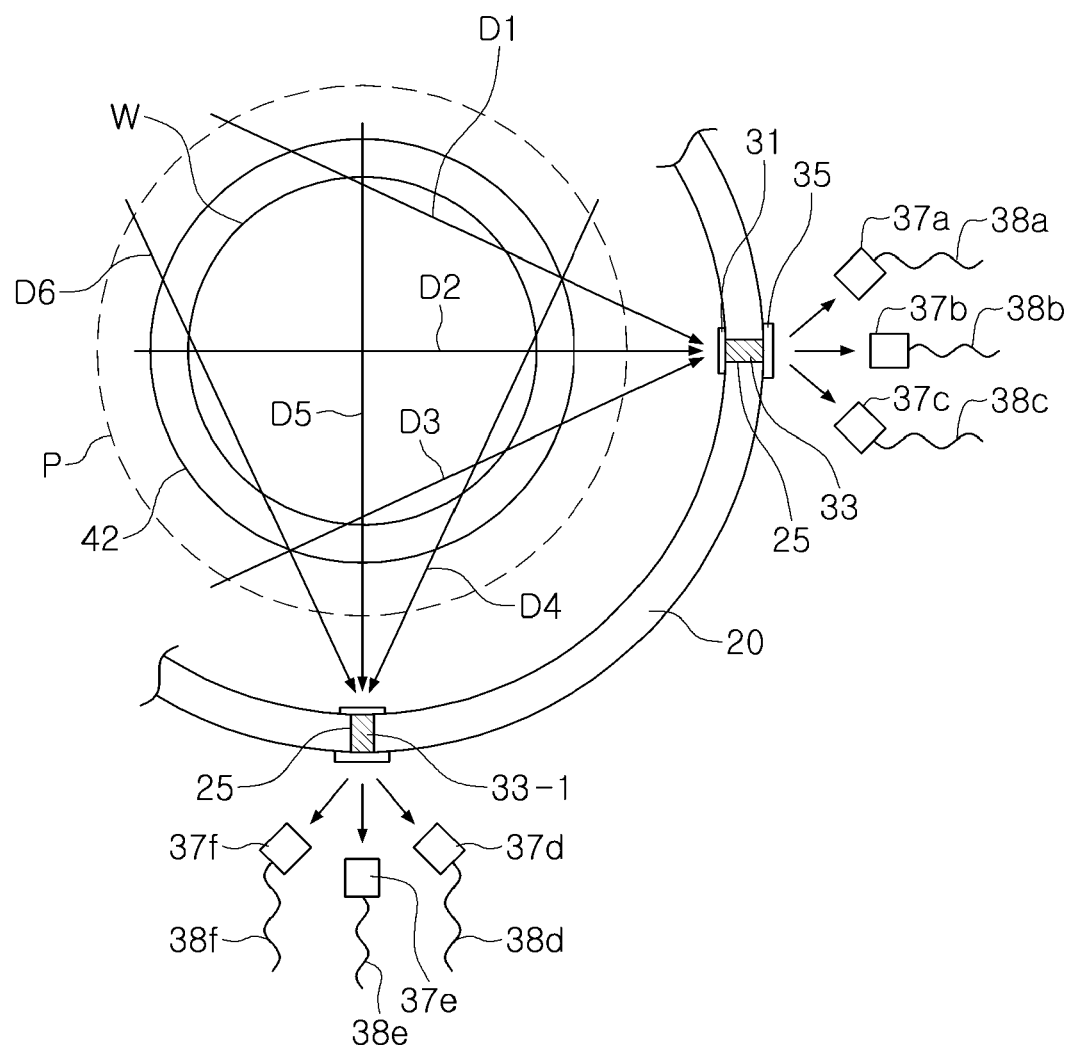
FIG. 15 is a view illustrating certain components of a plasma processing apparatus attached to a processing chamber according to an example embodiment.

FIG. 15 is a view illustrating components of a plasma processing apparatus 10 according to an example embodiment.

Referring to FIG. 15, the plasma processing apparatus (10, see also FIG. 1) includes a plurality of holes 25 formed on a side wall of the processing chamber 20, and may include a plurality of reflective structures 33, 33-1, disposed in the plurality of holes, respectively. The plurality of reflective structures 33 may be disposed at a predetermined interval. For example, the plurality of reflective structures 33, 33-1 may be disposed at an interval of an angle of 90 degrees from one another.

The reflective structure 33 may output a plurality of fragments of light, incident in the reflective structure 33 at a plurality of different directions D1, D2, and D3 from the plasma P, in a plurality of different directions, and a plurality of light receiving devices 37a, 37b, and 37c may receive the plurality of fragments of light output in a plurality of different directions, respectively, from the reflective structure 33. A plurality of optical cables 38a, 38b, and 38c may be connected to the plurality of light receiving devices 37a, 37b, and 37c, respectively A reflective structure 33-1 may also output a plurality of fragments of light, incident in the reflective structure 33-1 at a plurality of different directions D4, D5, and D6 from the plasma P, in a plurality of different directions. The plurality of light receiving devices 37d, 37e, and 37f may receive the plurality of fragments of light, output in a plurality of different directions from the reflective structure 33-1, respectively. A plurality of optical cables 38d, 38e, and 38f may be connected to the plurality of light receiving devices 37d, 37e, and 37f, respectively.

The reflective structures 33, 33', 33", 133, 133', 233, 233' 333, and 333' of the example embodiments, described above, are extended through the hole 25 to have a portion protruding beyond an outer side surface of the processing chamber 20.

As set forth above, according to example embodiments, a plasma monitoring apparatus may observe plasma distribution for various regions in a processing chamber, by employing a reflective structure in a hole formed in a side wall of a processing chamber.

Thus, uniformity of the plasma in the plasma processing apparatus may be maintained and managed.

While example embodiments have been shown and described above, it will be apparent to those skilled in the art that modifications and variations could be made without departing from the scope of the present disclosure, as defined by the appended claims.

What is claimed is:

1. A plasma monitoring apparatus, comprising:
   a reflective structure disposed on a processing chamber, the processing chamber providing a space in which plasma for processing a substrate is formed, the reflective structure configured to receive fragments of light incident in a plurality of incident directions from the plasma and configured to output the fragments of light in a plurality of exit directions;
   a shield disposed at a first end of the reflective structure, and having holes or slits transmitting a portion of light emitted from the plasma;
   a window disposed at a second end opposite to the first end of the reflective structure, and through which the fragments of light passing through the reflective structure are output;
   at least one light sensor configured to receive the fragments of light output from the window; and
   at least one optical spectrometer connected to the at least one light sensor,
   wherein the reflective structure comprises at least one pair of reflective surfaces disposed in parallel with each other, the at least one pair of reflective surfaces being spaced apart from each other in a first direction extending perpendicularly to an upper surface of the substrate.

2. The plasma monitoring apparatus of claim 1, wherein the at least one pair of reflective surfaces oppose each other in a direction parallel with an upper surface of the substrate.

3. The plasma monitoring apparatus of claim 2, wherein the reflective structure comprises a plurality of regions, along an axial direction of the reflective structure, including:
a first region having a first separation distance between the at least one pair of reflective surfaces; and
a second region having a second separation distance between the at least one pair of reflective surfaces, and
wherein the first separation distance and the second separation distance are different from each other.

4. The plasma monitoring apparatus of claim 3, wherein a first length of the first region and a second length of the second region are different from each other in the axial direction.

5. The plasma monitoring apparatus of claim 1, wherein:
the reflective structure comprises
a body comprising a through-hole having a rectangular column shape, the body being formed of a reflective material,
wherein the at least one pair of reflective surfaces correspond to inner side surfaces of the body.

6. The plasma monitoring apparatus of claim 1, wherein the reflective structure comprises:
a first pair of reflective surfaces extending parallel with each other;
a second pair of reflective surfaces extending parallel with each other;
a through-hole having a rectangular column shape and including a reflective material,
wherein the first pair of reflective surfaces are inner side surfaces of the reflective structure, opposing each other, in a first direction, extending parallel with an upper surface of the substrate, and
wherein the second pair of reflective surfaces are inner side surfaces of the reflective structure, opposing each other, in a second direction, extending perpendicular to the upper surface of the substrate.

7. The plasma monitoring apparatus of claim 1, wherein the reflective structure comprises:
a core having a rectangular column shape; and
a body including a reflective material and surrounding the core, and
wherein the at least one pair of reflective surfaces are provided between the core and the body.

8. The plasma monitoring apparatus of claim 1, wherein the reflective structure comprises:
a body comprising a through-hole having a rectangular column shape; and
reflective layers, disposed on inner side surfaces of the reflective structure, opposing each other in a direction parallel with an upper surface of the substrate, and
wherein the at least one pair of reflective surfaces correspond to inner surfaces of the reflective layers.

9. The plasma monitoring apparatus of claim 1, wherein:
the at least one pair of reflective surfaces of the reflective structure are two pairs of reflective surfaces parallel with each other, respectively,
the reflective structure comprises:
a body comprising a through-hole having a rectangular column shape; and
reflective layers disposed on inner side surfaces of the body opposing each other in a first direction extending parallel with an upper surface of the substrate, and in a second direction extending perpendicular to the upper surface of the substrate, and
the two pairs of reflective surfaces correspond to inner surfaces of the reflective layers.

10. The plasma monitoring apparatus of claim 1, wherein:
the reflective structure comprises:
a core having a rectangular column shape;
a body surrounding the core; and
reflective layers disposed between the core and the body and opposing each other in a direction extending parallel with an upper surface of the substrate, and
the at least one pair of reflective surfaces are interfaces between the core and the reflective layers.

11. The plasma monitoring apparatus of claim 10, wherein the core includes a plurality of sub-cores sequentially disposed along an axial direction of the core and comprising:
a first sub-core; and
a second sub-core, and
wherein the first sub-core and the second sub-core have different refractive indices from each other.

12. The plasma monitoring apparatus of claim 1, wherein the reflective structure is disposed in at least one hole formed in the processing chamber, and
the reflective structure extends through the at least one hole and protrudes beyond the processing chamber.

13. The plasma monitoring apparatus of claim 1, wherein the reflective structure comprises
a heater disposed adjacent to each reflective surface of the at least one pair of reflective surfaces.

14. The plasma monitoring apparatus of claim 1, wherein:
the at least one hole comprises at least one diverging hole diverging toward the reflective structure, and
the at least one slit comprises at least one diverging slot diverging toward the reflective structure.

15. The plasma monitoring apparatus of claim 1, wherein the at least one light sensor is configured to move in a direction extending parallel with an upper surface of the substrate to receive the fragments of light output in the plurality of exit directions from the reflective structure.

16. The plasma monitoring apparatus of claim 1, wherein the at least one light sensor includes a plurality of light sensors aligned in different directions with respect to the reflective structure.

17. A plasma monitoring apparatus, comprising:
a reflective structure disposed on a processing chamber providing a space in which plasma for processing a substrate is formed, the reflective structure configured to receive fragments of light incident in a plurality of incident directions from the plasma, and output the fragments of light in a plurality of exit directions by reflecting the fragments of light within the reflective structure;
at least one light sensor configured to receive the fragments of light passing through the reflective structure in the plurality of exit directions; and
at least one optical spectrometer connected to the at least one light sensor,
wherein the reflective structure comprises at least one pair of reflective surfaces extending parallel with each other,
wherein the at least one pair of reflective surfaces oppose each other in a direction parallel with an upper surface of the substrate,
wherein the reflective structure comprises a plurality of regions, along an axial direction of the reflective structure, including:

a first region having a first separation distance between the at least one pair of reflective surfaces; and a second region having a second separation distance between the at least one pair of reflective surfaces, and wherein the first separation distance and the second separation distance are different from each other.

18. A plasma monitoring apparatus, comprising:

a reflective structure disposed on a processing chamber providing a space in which plasma for processing a substrate is formed, the reflective structure configured to receive fragments of light incident in a plurality of incident directions from the plasma, and output the fragments of light in a plurality of exit directions by reflecting the fragments of light within the reflective structure;

at least one light sensor configured to receive the fragments of light passing through the reflective structure in the plurality of exit directions; and at least one optical spectrometer connected to the at least one light sensor, wherein the reflective structure comprises:
at least one pair of reflective surfaces extending parallel with each other;
a core having a rectangular column shape;
a body surrounding the core; and
reflective layers disposed between the core and the body and opposing each other in a direction extending parallel with an upper surface of the substrate, and the at least one pair of reflective surfaces are interfaces between the core and the reflective layers.

19. The plasma monitoring apparatus of claim 18, wherein the core includes a plurality of sub-cores sequentially disposed along an axial direction of the core and comprising:

a first sub-core; and a second sub-core, and wherein the first sub-core and the second sub-core have different refractive indices from each other.

* * * * *